(12) United States Patent
Lewis et al.

(10) Patent No.: US 10,724,804 B2
(45) Date of Patent: Jul. 28, 2020

(54) METHOD AND DEVICE FOR SPREADING HIGH HEAT FLUXES IN THERMAL GROUND PLANES

(71) Applicant: Kelvin Thermal Technologies, Inc., Boulder, CO (US)

(72) Inventors: Ryan John Lewis, Boulder, CO (US); Ronggui Yang, Broomfield, NY (US); Yung-Cheng Lee, Boulder, CO (US)

(73) Assignee: Kelvin Thermal Technologies, Inc., Boulder, CO (US)

( * ) Notice: Subject to any disclaimer, the term of this patent is extended or adjusted under 35 U.S.C. 154(b) by 64 days.

(21) Appl. No.: 15/806,723

(22) Filed: Nov. 8, 2017

(65) Prior Publication Data

US 2018/0128553 A1 May 10, 2018

Related U.S. Application Data

(60) Provisional application No. 62/419,272, filed on Nov. 8, 2016.

(51) Int. Cl.
| | | |
|---|---|---|
| F28D 15/04 | (2006.01) | |
| F28F 3/02 | (2006.01) | |
| F28D 15/02 | (2006.01) | |

(52) U.S. Cl.
CPC .......... *F28D 15/046* (2013.01); *F28F 3/022* (2013.01); *F28D 2015/0225* (2013.01); *F28F 2255/20* (2013.01)

(58) Field of Classification Search
CPC ........ F28D 15/046; F28D 15/04; F28F 3/022; F28F 3/048; F28F 2255/20; F28F 2260/02

USPC .................................................... 165/104.26
See application file for complete search history.

(56) References Cited

U.S. PATENT DOCUMENTS

| | | | |
|---|---|---|---|
| 4,000,776 A | | 1/1977 | Kroebig et al. |
| 4,274,479 A | * | 6/1981 | Eastman ............... F28D 15/046 |
| | | | 122/366 |
| 4,545,799 A | | 10/1985 | Rhodes et al. |
| 4,854,379 A | | 8/1989 | Shaubach et al. |
| 5,560,423 A | | 10/1996 | Larson et al. |
| 5,735,339 A | | 4/1998 | Davenport |
| 6,056,044 A | * | 5/2000 | Benson ............... F28D 15/0233 |
| | | | 165/104.26 |
| 6,158,502 A | | 12/2000 | Thomas |

(Continued)

FOREIGN PATENT DOCUMENTS

| | | | |
|---|---|---|---|
| JP | H1197871 A | 4/1999 | |
| JP | 2011080679 A * | 4/2011 | ............ F28F 13/187 |

(Continued)

OTHER PUBLICATIONS

U.S. Office Action in U.S. Appl. No. 15/292,932 dated Dec. 11, 2018, 12 pages.

(Continued)

*Primary Examiner* — Tho V Duong

(57) ABSTRACT

A thermal ground plane with hybrid structures that include nanowires is disclosed. The thermal ground plane includes a first casing having an exterior surface and an interior surface, the interior surface includes plurality of microstructures with a plurality of nanowires; a second casing, wherein the first casing and the second casing are sealed to an interior space that includes a working fluid; and a wicking layer disposed within the interior space.

18 Claims, 16 Drawing Sheets

(56) References Cited

U.S. PATENT DOCUMENTS

| | | |
|---|---|---|
| 6,446,706 B1 | 9/2002 | Rosenfeld et al. |
| 6,533,029 B1 | 3/2003 | Phillips |
| 6,763,671 B1 | 7/2004 | Klett |
| 6,912,130 B2 | 6/2005 | Osanai et al. |
| 6,938,481 B2 | 9/2005 | Paterek et al. |
| 6,994,151 B2 | 2/2006 | Zhou et al. |
| 7,037,400 B1 | 5/2006 | Shaw |
| 7,069,978 B2 | 7/2006 | Rosenfeld et al. |
| 8,579,018 B1 | 11/2013 | Roper et al. |
| 8,807,203 B2 | 8/2014 | Macdonald et al. |
| 9,136,883 B1 | 9/2015 | Moher et al. |
| 9,651,312 B2 | 5/2017 | Yang et al. |
| 9,835,383 B1 | 12/2017 | Roper et al. |
| 9,909,814 B2 | 3/2018 | Yang et al. |
| 9,921,004 B2 | 3/2018 | Lewis et al. |
| 2003/0042009 A1 | 3/2003 | Phillips |
| 2003/0102118 A1 | 6/2003 | Sagal et al. |
| 2003/0136547 A1 | 7/2003 | Gollan et al. |
| 2003/0136551 A1 | 7/2003 | Bakke |
| 2003/0159806 A1 | 8/2003 | Sehmbey et al. |
| 2004/0011509 A1 | 1/2004 | Siu |
| 2004/0131877 A1 | 7/2004 | Hasz et al. |
| 2005/0059238 A1 | 3/2005 | Chen et al. |
| 2005/0126757 A1* | 6/2005 | Bennett ............... F28D 15/046 165/104.11 |
| 2005/0280128 A1 | 12/2005 | Mok et al. |
| 2005/0280162 A1* | 12/2005 | Mok ..................... H01L 23/427 257/778 |
| 2006/0090882 A1 | 5/2006 | Sauciuc |
| 2006/0098411 A1 | 5/2006 | Lee |
| 2006/0124280 A1 | 6/2006 | Lee et al. |
| 2006/0131002 A1 | 6/2006 | Mochizuki et al. |
| 2006/0196640 A1 | 9/2006 | Siu |
| 2006/0196641 A1 | 9/2006 | Hong et al. |
| 2006/0213648 A1 | 9/2006 | Chen et al. |
| 2006/0283574 A1 | 12/2006 | Huang |
| 2006/0283576 A1 | 12/2006 | Lai et al. |
| 2007/0035927 A1 | 2/2007 | Erturk et al. |
| 2007/0056714 A1 | 3/2007 | Wong |
| 2007/0068657 A1 | 3/2007 | Yamamoto et al. |
| 2007/0077165 A1 | 4/2007 | Hou et al. |
| 2007/0089864 A1 | 4/2007 | Chang et al. |
| 2007/0107875 A1 | 5/2007 | Lee et al. |
| 2007/0158050 A1 | 7/2007 | Norley |
| 2008/0017356 A1 | 1/2008 | Gruss et al. |
| 2008/0111151 A1 | 5/2008 | Teraki et al. |
| 2008/0128898 A1 | 6/2008 | Henderson et al. |
| 2008/0210407 A1 | 9/2008 | Kim et al. |
| 2008/0224303 A1* | 9/2008 | Funakoshi ............ H01L 23/051 257/701 |
| 2008/0272482 A1 | 11/2008 | Jensen et al. |
| 2009/0020272 A1* | 1/2009 | Shimizu ............... H01L 23/427 165/104.33 |
| 2009/0056917 A1 | 3/2009 | Majumdar et al. |
| 2009/0236080 A1 | 9/2009 | Lin et al. |
| 2009/0294104 A1 | 12/2009 | Lin et al. |
| 2009/0316335 A1 | 12/2009 | Simon et al. |
| 2010/0028604 A1* | 2/2010 | Bhushan ................. B05D 1/60 428/156 |
| 2010/0053899 A1* | 3/2010 | Hashimoto ........... F28D 15/046 361/701 |
| 2010/0084113 A1 | 4/2010 | Lee |
| 2010/0139767 A1 | 6/2010 | Hsieh et al. |
| 2010/0200199 A1 | 8/2010 | Habib et al. |
| 2010/0252237 A1* | 10/2010 | Hashimoto ........... F28D 15/046 165/104.21 |
| 2010/0254090 A1* | 10/2010 | Trautman ............. F28D 15/046 361/704 |
| 2010/0290190 A1 | 11/2010 | Chester et al. |
| 2010/0300656 A1 | 12/2010 | Lu |
| 2011/0017431 A1* | 1/2011 | Yang .................... F28D 15/046 165/104.26 |
| 2011/0083829 A1 | 4/2011 | Hung et al. |
| 2011/0198059 A1* | 8/2011 | Gavillet ................ F28D 15/046 165/104.26 |
| 2011/0205708 A1 | 8/2011 | Andry et al. |
| 2012/0061127 A1 | 3/2012 | Fields et al. |
| 2012/0186784 A1 | 7/2012 | Yang et al. |
| 2012/0189839 A1 | 7/2012 | Aoki et al. |
| 2012/0241216 A1 | 9/2012 | Coppeta et al. |
| 2013/0049018 A1 | 2/2013 | Ramer et al. |
| 2013/0199770 A1 | 8/2013 | Cherian |
| 2013/0269913 A1 | 10/2013 | Ueda et al. |
| 2013/0327504 A1 | 12/2013 | Bozorgi et al. |
| 2014/0017456 A1* | 1/2014 | Xiao ..................... B08B 17/065 428/195.1 |
| 2014/0238645 A1* | 8/2014 | Enright ................... F28D 15/02 165/104.21 |
| 2014/0238646 A1 | 8/2014 | Enright |
| 2014/0247556 A1* | 9/2014 | Eid ..................... H01L 23/3675 361/700 |
| 2015/0226493 A1 | 8/2015 | Yang et al. |
| 2016/0076820 A1 | 3/2016 | Lewis et al. |
| 2016/0081227 A1 | 3/2016 | Lee et al. |

FOREIGN PATENT DOCUMENTS

| | | |
|---|---|---|
| WO | 2008044823 A1 | 4/2008 |
| WO | 2013144444 | 10/2013 |

OTHER PUBLICATIONS

U.S. Office Action in U.S. Appl. No. 14/857,567 dated Aug. 2, 2018, 29 pages.
U.S. Restriction Requirement in U.S. Appl. No. 15/436,632 dated Oct. 10, 2018, 5 pages.
U.S. Restriction Requirement in U.S. Appl. No. 15/292,932 dated Aug. 30, 2018, 5 pages.
U.S. Office Action in U.S. Appl. No. 14/857,567 dated Oct. 30, 2018, 27 pages.
U.S. Office Action in U.S. Appl. No. 14/787,455 dated Sep. 27, 2018, 13 pages.
U.S. Office Action in U.S. Appl. No. 14/853,833 dated Apr. 25, 2018, 11 pages.
International Search Report and Written Opinion, as issued in connection with International Patent Application No. PCT/US2018/31632, dated Oct. 15, 2018, 16 pgs.
U.S. Office Action in U.S. Appl. No. 14/853,833 dated Nov. 19, 2018, 11 pages.
U.S. Office Action in U.S. Appl. No. 14/857,567 dated Nov. 21, 2017, 11 pages.
U.S. Office Action in U.S. Appl. No. 14/861,708 dated May 9, 2017, 8 pages.
U.S. Notice of Allowance in U.S. Appl. No. 14/861,708 dated Oct. 25, 2017, 9 pages.
International Search Report and Written Opinion dated Jan. 17, 2018 in related PCT Application No. PCT/US2017/060550 (11 pages).
International Search Report and Written Opinion, as issued in connection with International Patent Application No. PCT/US2015/050031, dated Dec. 18, 2015, 10 pgs.
International Search Report and Written Opinion, as issued in connection with International Patent Application No. PCT/US2015/050771, dated Dec. 18, 2015, 8 pgs.
U.S. Office Action in U.S. Appl. No. 12/719,775, dated Nov. 9, 2012, 15 pgs.
U.S. Office Action in U.S. Appl. No. 12/719,775, dated May 9, 2013, 15 pgs.
U.S. Office Action in U.S. Appl. No. 12/719,775, dated Oct. 2, 2013, 15 pgs.
U.S. Office Action in U.S. Appl. No. 12/719,775, dated Mar. 26, 2014, 23 pgs.
U.S. Office Action in U.S. Appl. No. 12/719,775, dated Feb. 6, 2015, 24 pgs.
U.S. Notice of Allowance in U.S. Appl. No. 12/719,775, dated Aug. 4, 2015, 8 pgs.

(56) References Cited

OTHER PUBLICATIONS

U.S. Office Action in U.S. Appl. No. 14/681,624, dated Oct. 23, 2015, 11 pgs.
International Search Report and Written Opinion dated Jul. 15, 2016 in related PCT Application No. PCT/US2015/057885 (11 pages).
U.S. Notice of Allowance in U.S. Appl. No. 14/681,624, dated Nov. 17, 2016, 7 pgs.
U.S. Office Action in U.S. Appl. No. 14/681,624, dated May 5, 2016, 10 pgs.
U.S. Office Action in U.S. Appl. No. 14/925,787, dated Aug. 9, 2017, 15 pgs.
U.S. Office Action in U.S. Appl. No. 14/925,787, dated Sep. 28, 2017, 9 pages.
U.S. Restriction Requirement in U.S. Appl. No. 14/853,833, dated Aug. 30, 2017, 7 pages.
U.S. Notice of Allowance in U.S. Appl. No. 14/925,787, dated Nov. 9, 2017, 7 pgs.
U.S. Office Action in U.S. Appl. No. 14/853,833, dated Oct. 6, 2017, 12 pages.
U.S. Office Action in U.S. Appl. No. 15/806,723 dated Apr. 5, 2019, 11 pages.
U.S. Office Action in U.S. Appl. No. 14/857,567 dated Mar. 21, 2019, 27 pages.
U.S. Office Action in U.S. Appl. No. 14/853,883, dated Mar. 29, 2019, 27 pages.
U.S. Office Action in U.S. Appl. No. 15/292,932, dated Mar. 29, 2019, 13 pages.
U.S. Office Action in U.S. Appl. No. 15/436,632, dated Feb. 5, 2019, 9 pages.
U.S. Office Action in U.S. Appl. No. 15/787,455, dated Apr. 1, 2019, 19 pages.

* cited by examiner

METHOD AND DEVICE FOR SPREADING HIGH HEAT FLUXES IN THERMAL GROUND PLANES

BACKGROUND

Thermal management can include any number of process and/or devices. In electronics, thermal management typically includes the transfer of heat from one area to another area. Typical thermal management has included fans and various other large mechanical devices. The miniaturization of devices such as mobile phones, watches, tablets, wearables, power electronics, power amplifiers, batteries, electric vehicles, etc. requires more nuanced thermal management techniques. There is a need for thin yet effective thermal management devices.

SUMMARY

A thermal ground plane that includes nanowires is disclosed. The thermal ground plane includes a first casing having an exterior surface and an interior surface, the interior surface includes plurality of microstructures with a plurality of nanowires; a second casing member, wherein the first casing and the second casing are sealed to an interior space that includes a working fluid; and a wicking layer disposed within the interior space.

In some embodiments, a thermal ground plane may include a first casing having an exterior surface and an interior surface, the interior surface includes plurality of microstructures with a plurality of nanowires; a second casing member, wherein the first casing and the second casing are sealed to an interior space that includes a working fluid; and a wicking structure disposed within the interior space.

In some embodiments, the plurality of micropillars may have a base dimension less than about 100 μm.

In some embodiments, the average length of the plurality of nanowires may be less than about 100 μm.

In some embodiments, the plurality of nanowires may be fabricated by depositing an aluminum layer to form a porous anodic alumina template followed by electroplating.

In some embodiments, the plurality of microstructures may comprise a trapezoidal shape.

In some embodiments, the plurality of microstructures may comprise a pyramidal shape.

In some embodiments, the plurality of microstructures may be fabricated by a technique selected from the list consisting of micro-stamping, partially metal cutting, reactive ion etching (RIE), and electroplating.

In some embodiments, the plurality of microstructures may comprise a forest of micro-posts with caps.

In some embodiments, the thermal ground plane further comprising a heat spreader disposed on the exterior surface of the first casing.

In some embodiments, the plurality of nanowires may further comprise a laminate layer.

In some embodiments, the thermal ground plane may further comprise a plurality of grooves formed on an interior surface of the second casing.

In some embodiments, the thermal ground plane may further comprise a plurality of grooves formed on the interior surface of the first casing.

In some embodiments, the thermal ground plane may further comprise a plurality of nanowires disposed on a planar portion of the interior surface of the first casing.

In some embodiments, a thermal ground plane may include a first casing having an exterior surface and an interior surface, the interior surface includes a plurality of nanowire bundles have two or more dimensions less than about 100 μm; a second casing member, wherein the first casing and the second casing are sealed to an interior space that includes a working fluid; and a wicking structure disposed within the interior space.

In some embodiments, at least two of the nanowire bundles may be disposed with a spacing of less than 65 μm between the two nanowire bundles.

In some embodiments, the nanowire bundles may include a protective coating such as, for example, an ALD coating.

In some embodiments, the average length of the plurality of nanowires may be less than about 100 μm.

Some embodiments may include a thermal ground plane including a first casing having an exterior surface and an interior surface, the interior surface includes a plurality of extended members and a plurality of nanostructures disposed on the plurality of extended members; a second casing member, wherein the first casing and the second casing are sealed to an interior space that includes a working fluid; and a wicking structure disposed within the interior space.

In some embodiments, the plurality of extended members comprises a shape selected from the group consisting of a plurality grooves and a plurality trapezoidal shaped three-dimensional members.

In some embodiments, the plurality of extended members may be formed either on or in the first surface.

Some embodiments may include a thermal ground plane including: a first casing having an exterior surface and an interior surface comprising a plurality of microstructures, the plurality of microstructures includes a plurality of ALD layers deposited on the plurality of microstructures; a second casing member, wherein the first casing and the second casing are sealed to an interior space that includes a working fluid; and a wicking structure disposed within the interior space.

These various embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

A thermal ground plane with hybrid structures is disclosed. The thermal ground plane includes a first member having an exterior surface and an interior surface, the interior surface includes plurality of microstructures; a second casing, wherein the first casing and the second casing are sealed to an interior space that includes a working fluid; and a wicking layer disposed within the interior space. A microstructure, for example, may include a plurality of nanostructures (e.g., copper nanowires) that have a length less than about 100 µm. A nanostructure may include any structure or surface that has features (e.g., roughness) in the order of nanometers that can, for example, change the wettability, drag force, and/or capillary force, etc. of the nanostructure. A nanostructure can be fabricated from a structure of surface using either or both physical and chemical approaches.

As another example, the nanostructures may include an array of nanowires. As another example, a microstructure may include a plurality of microstructures (e.g., raised or extended members) disposed on an interior surface of a thermal ground plane (e.g., an interior surface of a casing) and a nanostructure (e.g., a plurality of nanowires). As another example, a microstructure may include a plurality of micro-posts with caps. Various other examples of microstructures are disclosed in this document.

Figure 1:
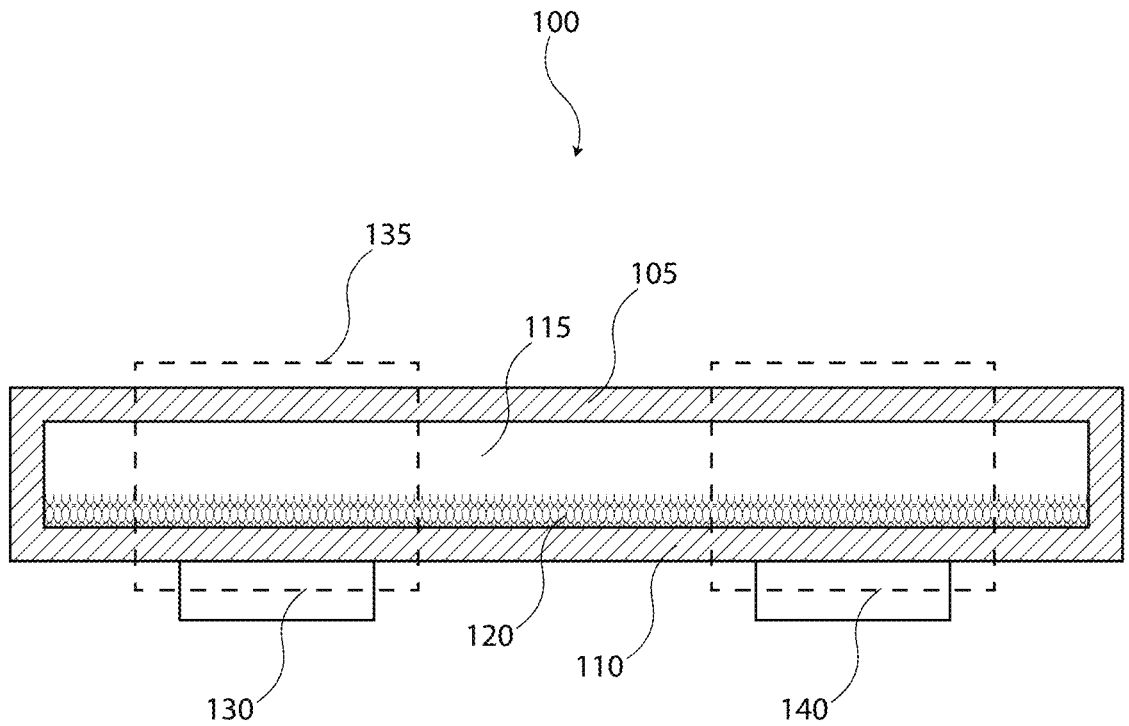
FIG. 1 is a diagram of an example thermal ground plane according to some embodiments.

FIG. 1 is a diagram of an example thermal ground plane 100 according to some embodiments. Thermal ground plane 100 includes a first casing 105 and a second casing 110 that are sealed together to enclose a vapor core 115 and/or a wicking structure 120. The first casing 105 and the second casing 110 may also enclose a working fluid within the vapor core and/or the wicking layer. The thermal ground plane 100 may be disposed near a heat source 130 and/or a heat sink 140. The area of the thermal ground plane 100 near the heat source 130 may be an evaporator region 135 and/or the area of thermal ground plane 100 near the heat sink 140 may a condenser region 145. Working fluid, for example, may evaporate from the heat produced by the heat source 130 at or near the evaporator region 135 and/or vapor may condense from the lack of heat from the heat sink 140 at or near the condenser region 145. Vapor may, for example, flow from the evaporator region 135 to the condenser region 145 via the vapor core 115. The working fluid may, for example, flow from the condenser region 145 to the evaporator region 135 via the wicking structure 120.

In some embodiments, the wicking structure 120 may be deposited on either or both the first casing 105 and the second casing 110. In some embodiments, the thermal ground plane (e.g., as part of the wicking structure 120) may include a plurality of microstructures. The microstructures may include, for example, a plurality of nanowires deposited on a plurality of micropillars, an array of nanowires, or a plurality of micro-posts with caps, etc.

In some embodiments, the working fluid may include water or any other coolant that may transfer heat from the evaporator region 135 to the condenser region 145, for example, through one or more of the following mechanisms: a) evaporation of the working fluid by absorption of heat dissipated from the heat source 130 to form vapor; b) vapor transport of the working fluid from the evaporator region 135 to the condenser region 145; c) condensation from vapor to liquid with cooling provided by the heat sink 145; and/or d) return of liquid from the condenser region 145 to the evaporator region 135 through capillary pumping pressure resulting from the wicking structure 120.

In some embodiments, a thermal ground plane's thermal performance can be dependent on the configuration yet can be about 3-50 times higher than that of copper.

In some embodiments, the first casing 105 and/or the second casing 110 and/or the wicking structure 120 may include copper, stainless steel, silicon, polymer, copper-clad Kapton, and/or flexible material, etc.

Figure 2:
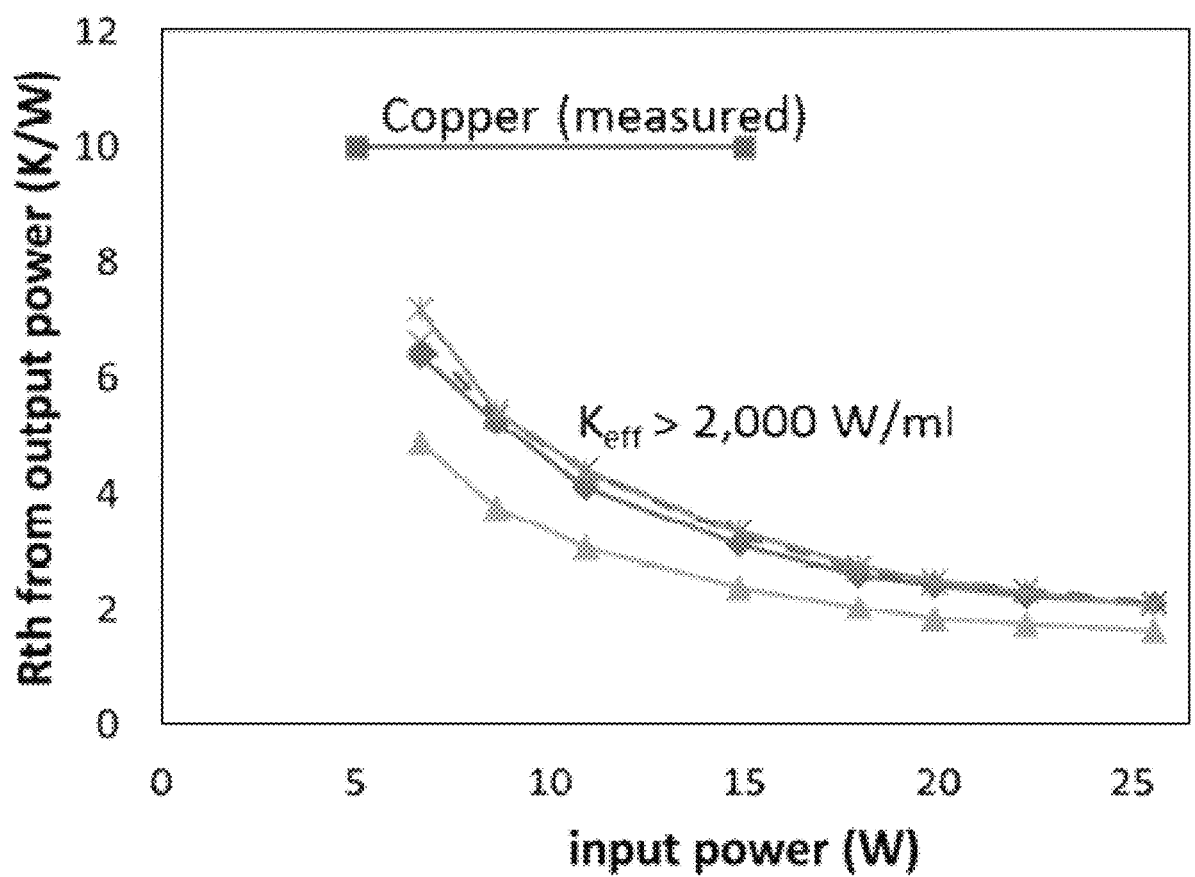
FIG. 2 is a graph illustrating the performance an example thermal ground plane that includes a woven copper mesh wicking structure.
Figure 3:
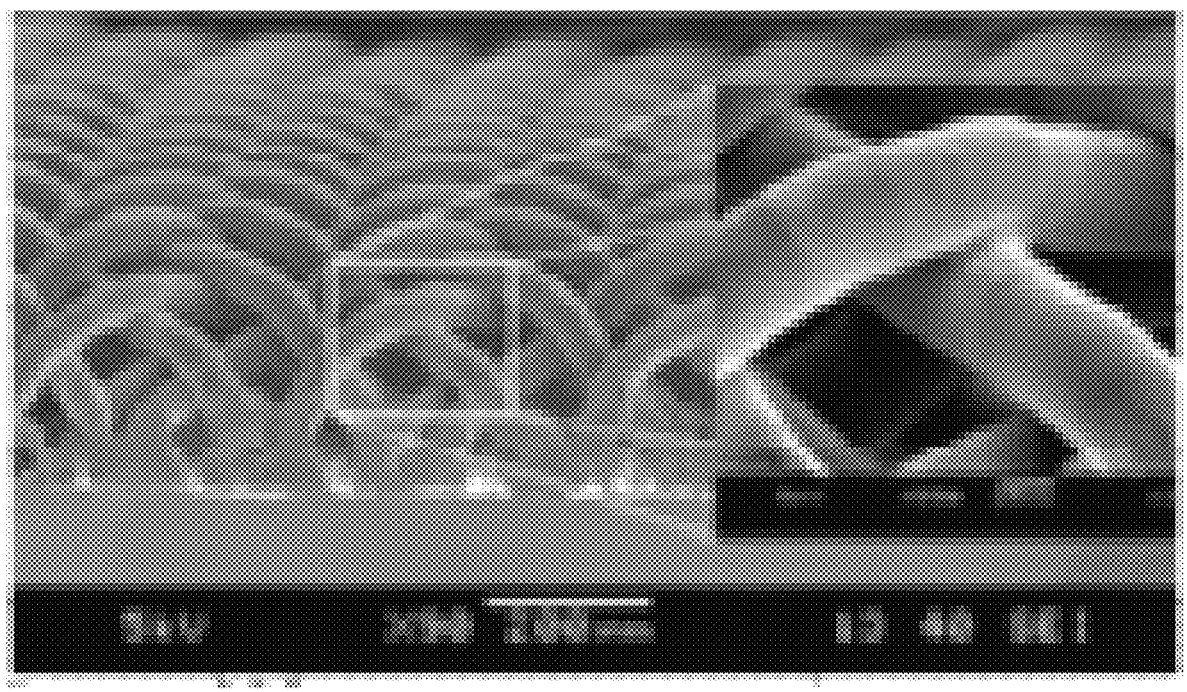
FIG. 3 is a photograph of an example woven copper mesh.

FIG. 2 is a graph illustrating the performance an example thermal ground plane that includes a woven copper mesh wicking structure 120 and/or evaporating layer. FIG. 3 is a photograph of an example woven copper mesh. In some embodiments, as shown in the figure, a flexible thermal ground plane can reach thermal conductivities greater than 2,000 W/m-K. In some embodiments, a flexible thermal ground plane can have a heat flux in the range of 1~5 $W/Cm^2$ over a heating area such as, for example, a heating area of 2.5 cm×2.5 cm.

Figure 4:
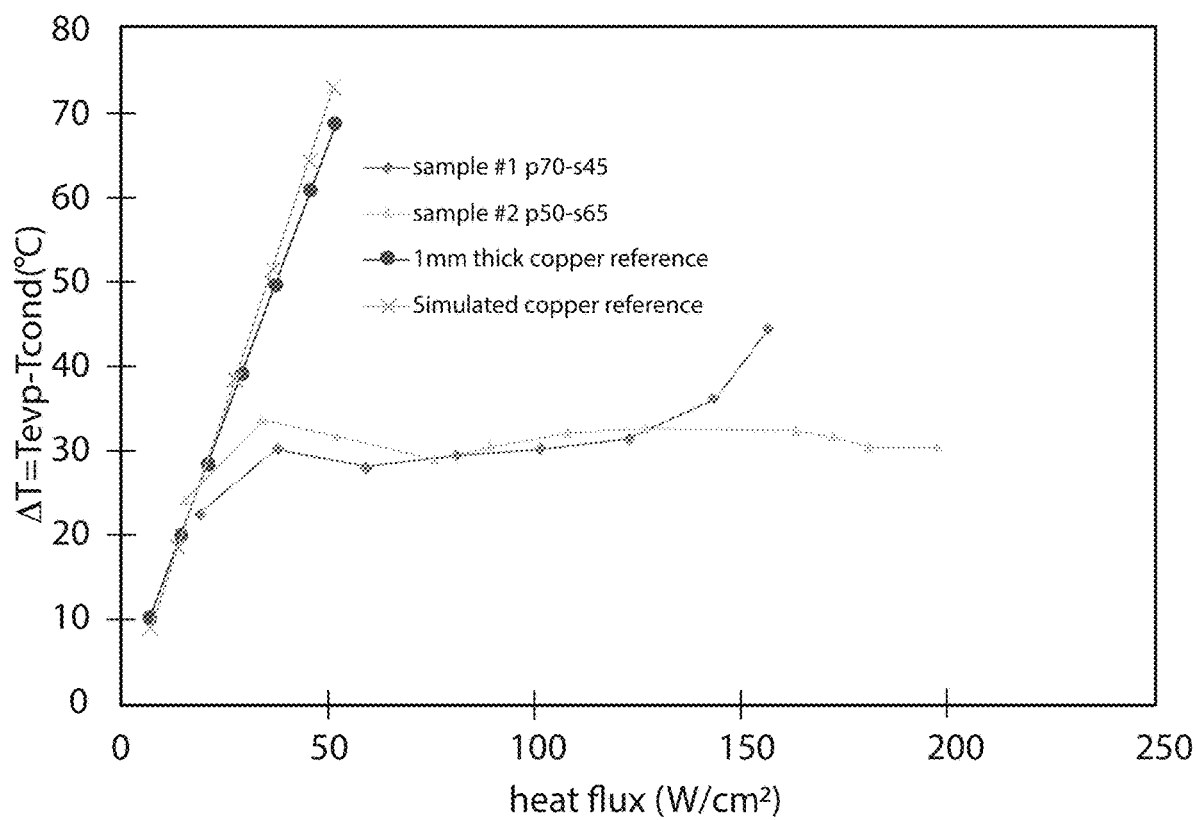
FIG. 4 is a graph illustrating the heat flux of various thermal ground planes.

In some embodiments, the heat flux of a thermal ground plane can be increased using various patterns or structures of nanowires as a wicking structure(s), as shown in the graph illustrated in FIG. 4. In this example, the wicking structure may include a nanowire structure; the first casing 105 and/or the second casing 110 may include a 100-400 µm (e.g., 200 µm) thick copper cladding material, and/or the vapor core may be 0.5-3.0 mm (e.g., 1 mm) thick. In some embodiments, a thermal ground plane can reduce the temperature rise for a large heat flux of 200 $W/cm^2$ over a large area, e.g. 1 cm×1 cm, to within only 30° C.

Figure 5A:
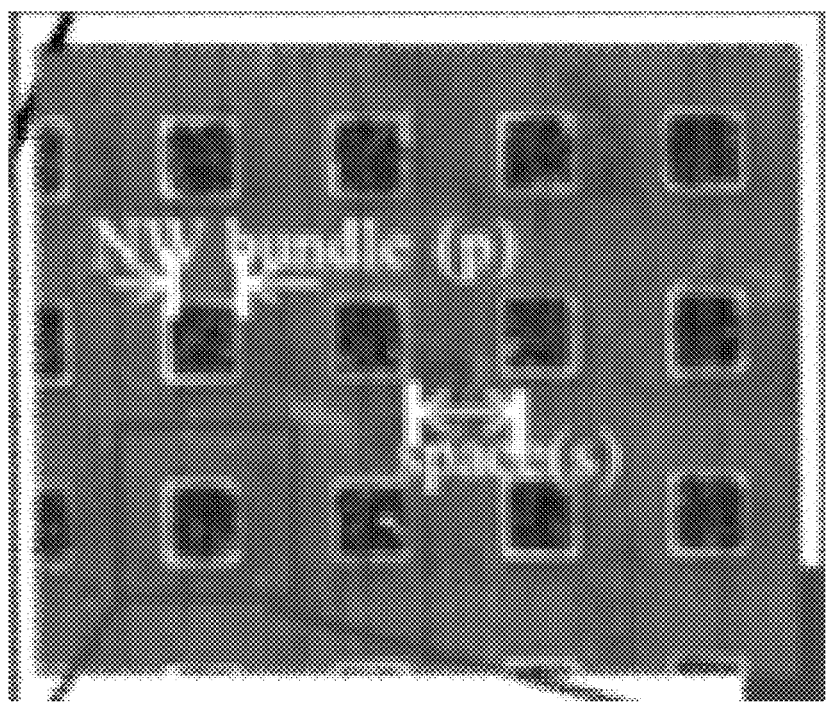
FIG. 5A illustrates an example array of nanowire structure according to some embodiments.
Figure 5B:
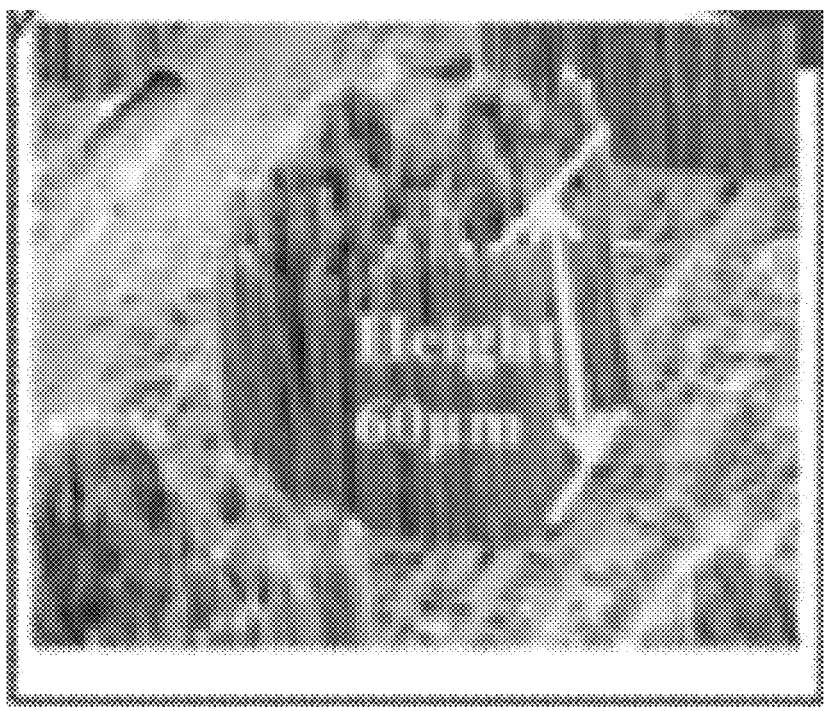
FIG. 5B illustrates an example nanowire structure.

FIG. 5A illustrates an example array of nanowire structures and FIG. 5B illustrates an example nanowire structure. In this example, an array of nanowire bundles may be deposited on the first casing 105 and/or the second casing 110. The nanowire bundles, for example, may have a dimension of about 30 µm to 100 µm or of about 50 µm to 70 µm with a height between 20 µm and 80 µm (e.g., 60 µm) (e.g., less than about 100 µm) with 30 µm to 100 µm or of about 50 µm to 70 µm spacing between nanowire bundles. In some embodiments, the diameter of each nanowire may be between about 10 nm and 500 nm.

Figure 6:
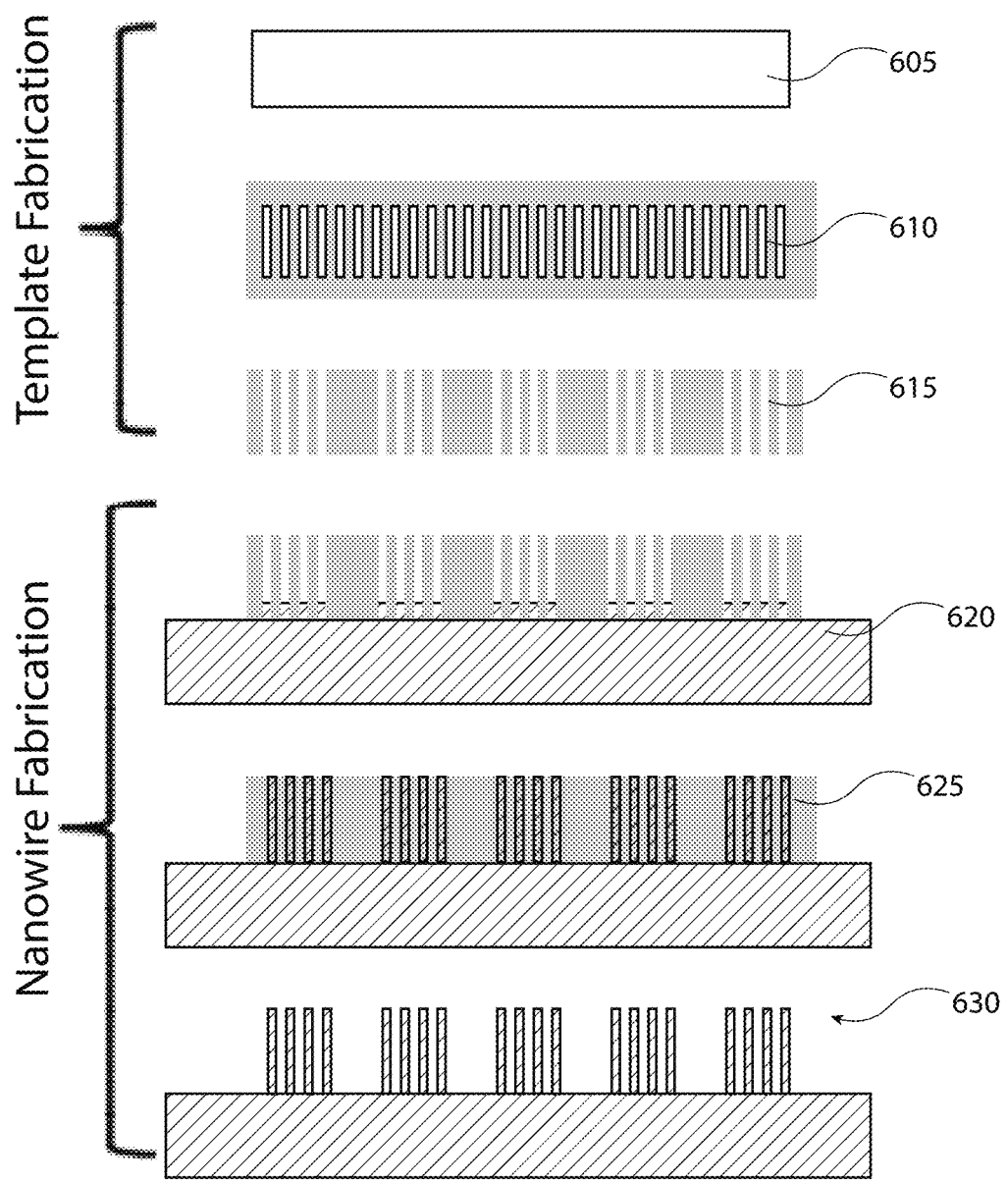
FIG. 6 illustrates a porous anodic alumina template process according to some embodiments.

In some embodiments, the nanowires can, for example, be grown electrochemically through a porous anodic alumina template process as shown in FIG. 6. A porous anodic alumina template 610 can be fabricated by oxidizing an aluminum sheet 605 in phosphoric acid under a DC current. Micro-arrays of nanochannels can be selectively opened to the surface using photolithography and wet etching. The porous anodic alumina template with channels 615 may then be bonded to a copper casing 620, and copper nanowires 625 can be grown through the porous anodic alumina nanochannels via electroplating. Finally, the porous anodic alumina can be released, revealing a micro-patterned copper nanowire array 630.

Figure 7:
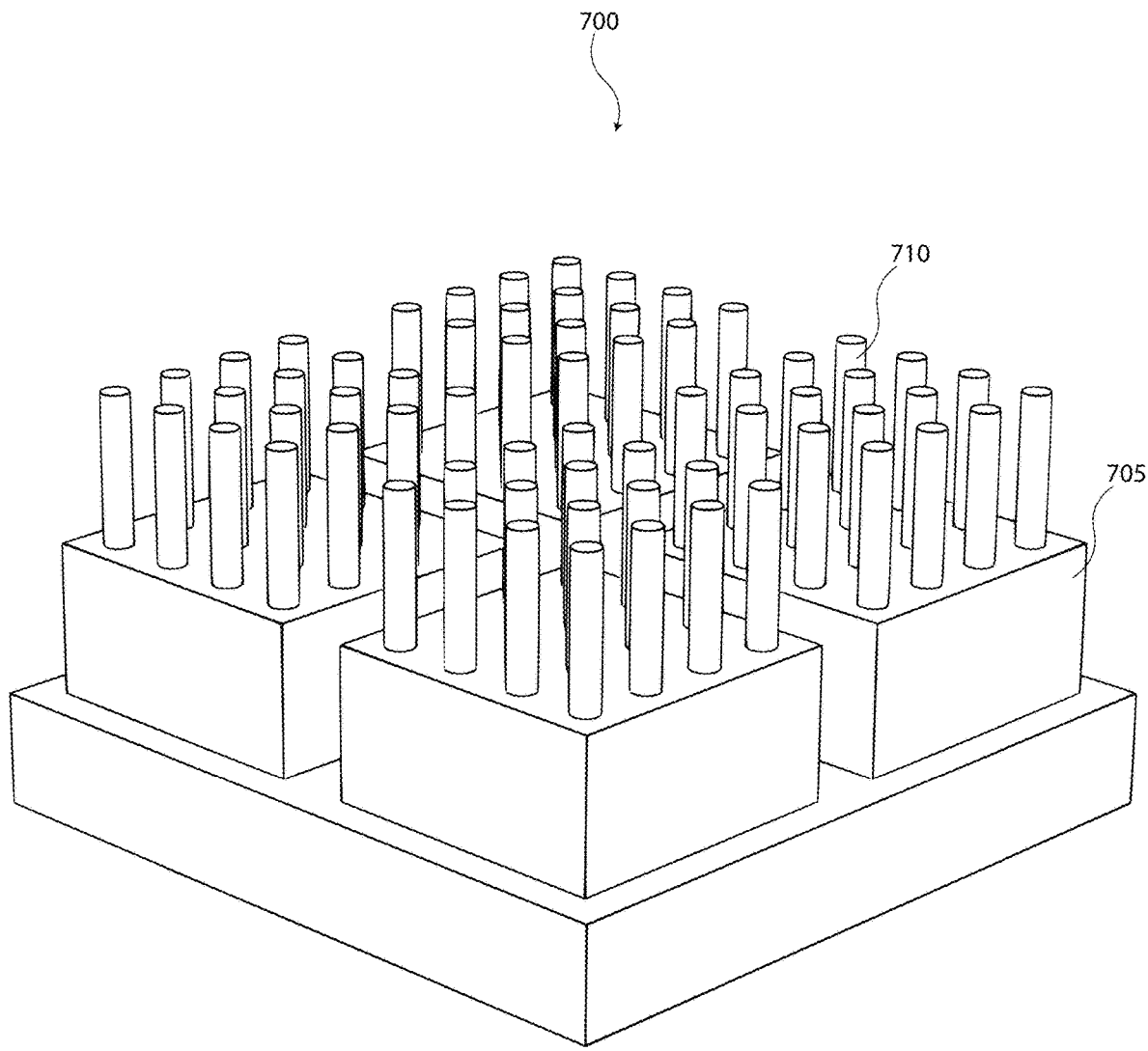
FIG. 7 illustrates an example wicking structure having a plurality of micropillars according to some embodiments.

In some embodiments, surfaces with a nanowire structure can improve the boiling heat transfer coefficient such as, for example, up to 80 kW/m²K. FIG. 7 shows an example wicking structure 700 having a plurality of micropillars 705 (in this example, four micropillars are shown). Each of the plurality of micropillars 705 include a nanowire array 710.

A nanowire array for example can provide a thermal ground plane with a heat transfer coefficient that is over twice the heat transfer coefficient of a thermal ground plane with a planar surface. A thermal ground plane with one or more nanowire structures, for example, heat transfer may be limited due to liquid water feeding limitations. In some embodiments, a hybrid structure can be used as shown in FIG. 7. In some embodiments, a thermal ground plane with a surface having a nanowire structure (or array) may have a heat transfer coefficient of up to 90 kW/m²K.

Figure 8:
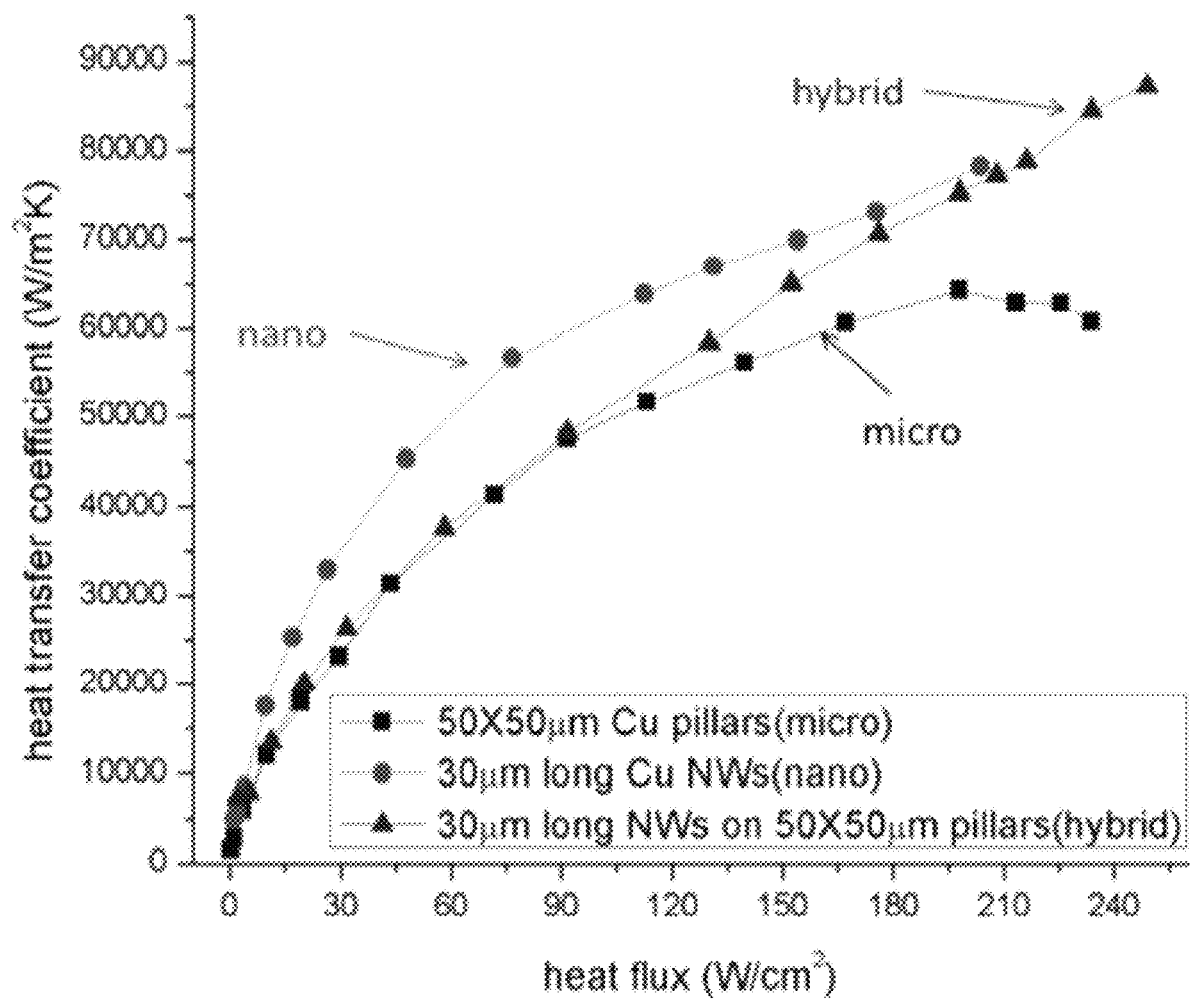
FIG. 8 is a graph showing the heat transfer coefficient of a number of three thermal ground planes vs heat flux.

FIG. 8 is a graph showing the heat transfer coefficient of a number of three thermal ground planes vs heat flux. One thermal ground plane may have a surface with a plurality of micropillars such as, for example, copper pillars with a 50 μm by 50 μm base. Another thermal ground plane may have a surface with a plurality of nanowires such as, for example, 30 μm long copper nanowires. Another thermal ground plane may have a hybrid structure that includes a plurality of micropillars (for example, 50 μm by 50 μm copper pillars) with nanowires (e.g., 30 μm long copper nanowires) disposed on the micropillars.

Figure 9:
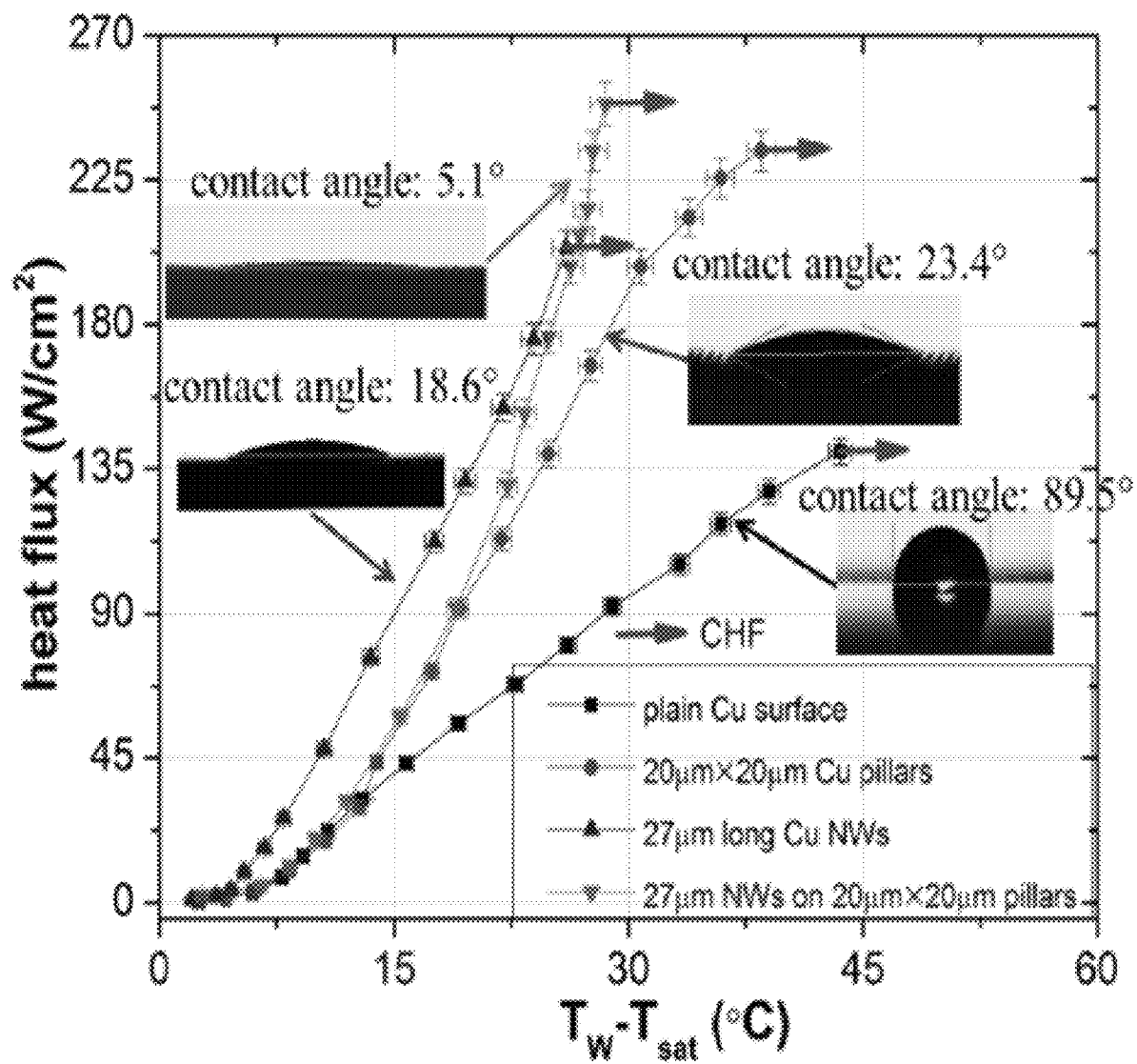
FIG. 9 is a graph showing the heat flux of a number of four thermal ground planes vs a temperature differential.

FIG. 9 is a graph showing the heat flux of four thermal ground planes vs a temperature difference between the wall temperature and the surrounding liquid temperature. The size of the heater used to create this example graph is about 8 mm×8 mm. One of the lines represents a thermal ground plane with a planar surface. Another line represents a thermal ground plane with a surface having a plurality of micropillars such as, for example, 20 μm by 20 μm copper pillars. Another line represents a thermal ground plane with a surface having a plurality of nanowires such as, for example, 27 μm long copper nanowires. And another line represents a thermal ground plane with a hybrid structure having a plurality of nanowires (for example, 27 μm long copper nanowires) disposed on a plurality of micropillars (for example, 20 μm by 20 μm copper pillars). In some embodiments, heat fluxes were improved from 135 W/cm² to over 250 W/cm² with a hybrid structure. In some embodiments, the copper casing can be very thin. In some embodiments, a thicker casing may be used to enhance heat spreading. In some embodiments, that casing can include a high thermal conductivity material that may be used to enhance heat spreading.

In some embodiments, for example, for high power electronics, heat fluxes as high as 1,000 W/cm² with a temperature difference can be achieved in the evaporator of only 10° C. In some embodiments, such performance may be achieved with the size of a chip, e.g. heat source, to be as large as 8 mm×8 mm, 10 mm×10 mm or even larger.

Figure 10A:
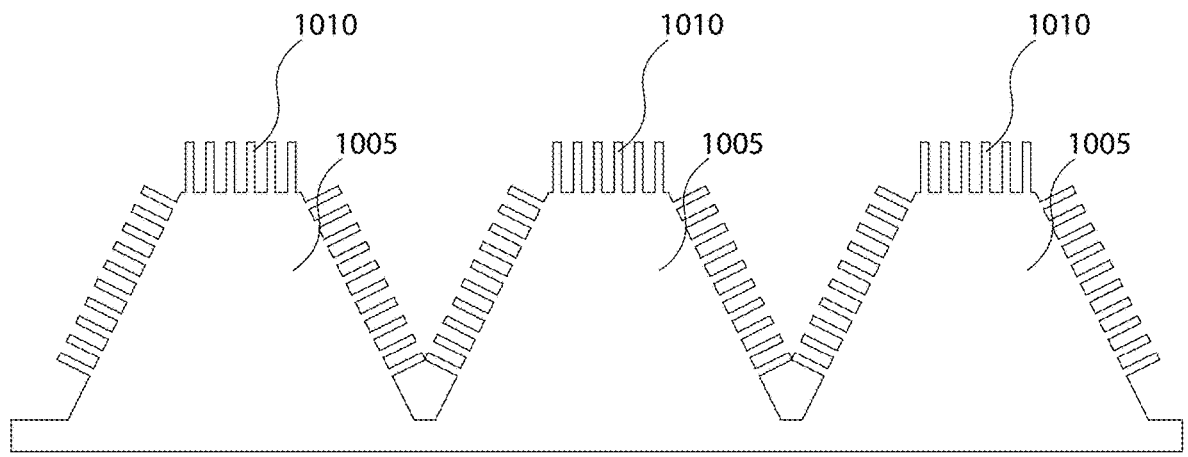
FIG. 10A illustrates a diagram of copper nanowires that are disposed on microstructures according to some embodiments.

FIG. 10A illustrates a diagram of copper nanowires 1010 that are disposed on microstructures 1005 (e.g., a micropillar). In this example, the microstructures 1005 has pyramidal or trapezoidal (or isosceles trapezoidal) shape. In some embodiments, an in-situ porous anodic alumina template process can be used to fabricate silicon nanowires on silicon surfaces that have angled slopes (e.g., 40°-70°, 50°-60°, 54°, etc.) patterned by KOH etching. In some embodiments, an in-situ grown porous anodized alumina may be grown on a casing by depositing an aluminum layer and oxidizing it under DC current. In some embodiments, a porous anodic alumina template may be bonded to a casing. After in-situ porous anodic alumina template is formed on inclined copper surfaces, copper nanowires can be electroplated on these surfaces using in-situ templates. The microstructures 1010 may include a plurality of grooves that may be formed by micro-stamping, metal cutting, reactive ion etching (RIE), electroplating, and/or other shape forming processes.

Figure 10B:
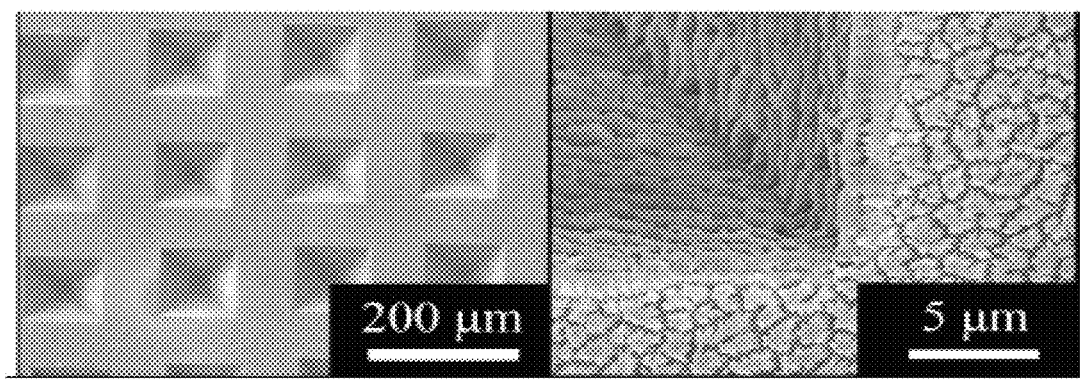
FIG. 10B show two images of microstructures with nanowires.

FIG. 10B show two images of microstructures with nanowires.

Figure 11:
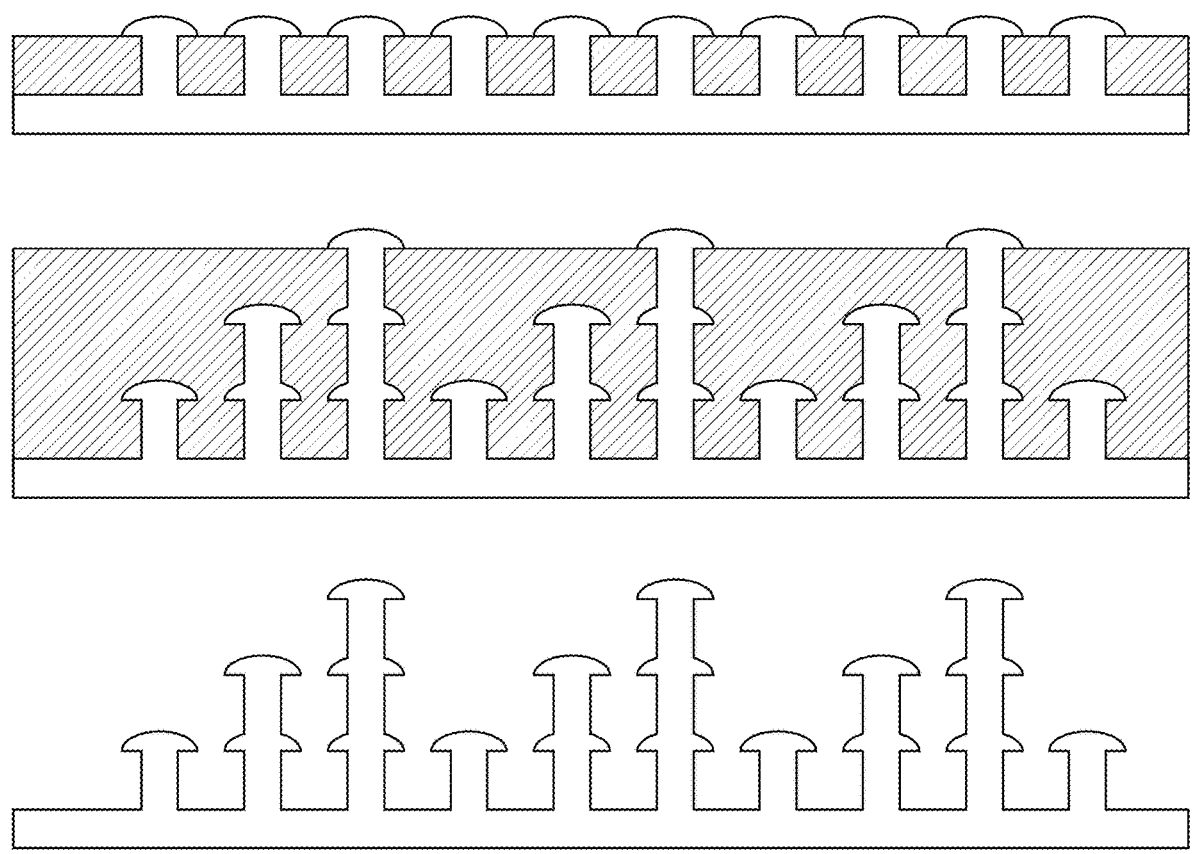
FIG. 11 illustrates a forest of posts and caps according to some embodiments.

In some embodiments, a surface of a thermal ground plane can include a forest of posts and caps as shown in FIG. 11. In some embodiments, multiple layers of posts can be formed by electroplating through openings in a photoresist layer. In each electroplating step, for example, mushroom-like caps can be formed by over plating. These microstructures can, for example, offer a large surface area with wicking elements three-dimensionally connected. In some embodiments, multiple micro-posts may be disposed on top of one another as shown in FIG. 11 to create regains with tall pillars and short pillars.

Figure 12:
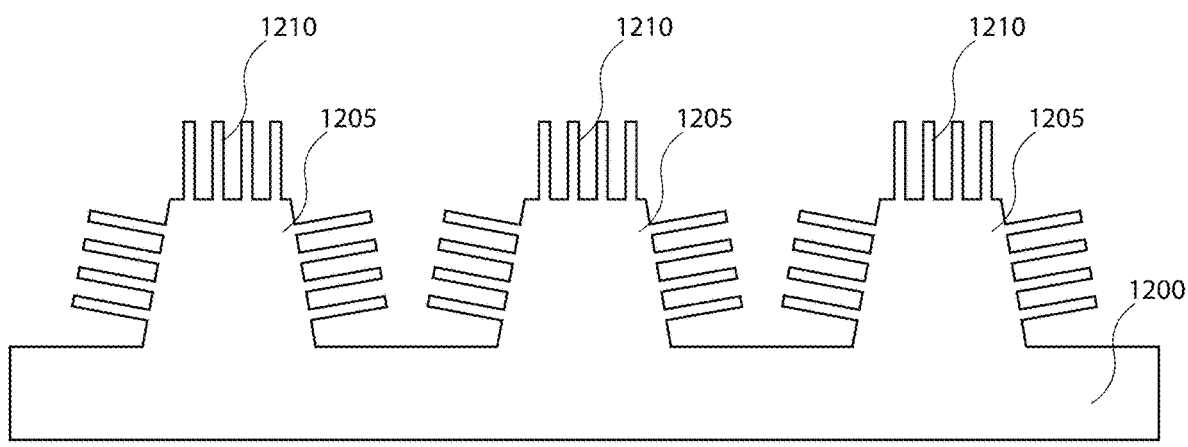
FIG. 12 illustrates an example of an interior surface of a casing of a thermal ground plane with microstructures having copper nanowires.

In some embodiments, inclined surfaces with copper nanowires may have a larger total effective surface area for evaporation than planar surfaces. FIG. 12 illustrates an example of an interior surface of a casing 1200 of a thermal ground plane with microstructures 1205 having copper nanowires 1210. In some embodiments, nanowires may be disposed on the surface of the casing between the microstructures 1205. In some embodiments, a thermal ground plane with microstructures 1205 having copper nanowires 1210 can spread 1,000 W from a heat source (e.g., a 1 cm×1 cm chip) to a heat sink (e.g., a 10 cm×10 cm heat sink). A thermal ground plane with microstructures 1205 having copper nanowires 1210 having dimensions, for example, of 10 cm×10 cm×2 mm may, for example, have thermal resistance from the hot spot to the heat sink of 0.04 Kcm²/W. In this example, the average temperature of the top side of the thermal ground plane with microstructures 1205 having copper nanowires 1210 may be as much as 200° C. with the heat sink temperature around 160° C. As another example, the thermal ground plane with microstructures 1205 having copper nanowires 1210 can be deformable or flexible. In this example, the temperature differences along the critical thermal path can include: capillary-fed boiling ($\Delta T_{Cu\ mesh}$=12.5° C., $\Delta T_{boiling}$=23° C.), vapor transport ($\Delta T_{vapor}$=1.25° C.), and/or condensation ($\Delta T_{condensation}$=2.25° C.). The $\Delta T_{Cu\ mesh}$ is the temperature difference resulting from heat conduction across the copper casing and microstructures before evaporation.

A thermal ground plane with inclined surfaces having copper nanowires may be used to reduce heat fluxes from 1,000 W/cm² to 10 W/cm².

In some embodiments, the heat sink temperature of a thermal ground plane with hybrid structures could reach around 160° C. as shown in FIG. 9. In some embodiments, the vapor pressure inside a thermal ground plane with hybrid structures may be determined by the saturation pressure of water; it could, for example, reach 7 atm at such a temperature. In some embodiments, a thermal ground plane with hybrid structures may include an internal bonding process to create a large number of copper posts that bond all the pieces in thermal ground plane (e.g., support pillars 1360 in FIG. 13 and FIG. 14). The bonding can be accomplished, for example, by diffusion bonding, thermosonic or therm-compression bonding, seam welding, ultrasound welding, or laser welding. In some embodiments, the surfaces to be bonded may be free from oxide; the oxide can be removed by acid cleaning, forming gas with a mixture of hydrogen and nitrogen, or formic acid vapor. Another approach may be to develop an external structure to "clamp" a thermal ground plane tightly to assure its mechanical integrity without a need of the internal posts.

Figure 13:
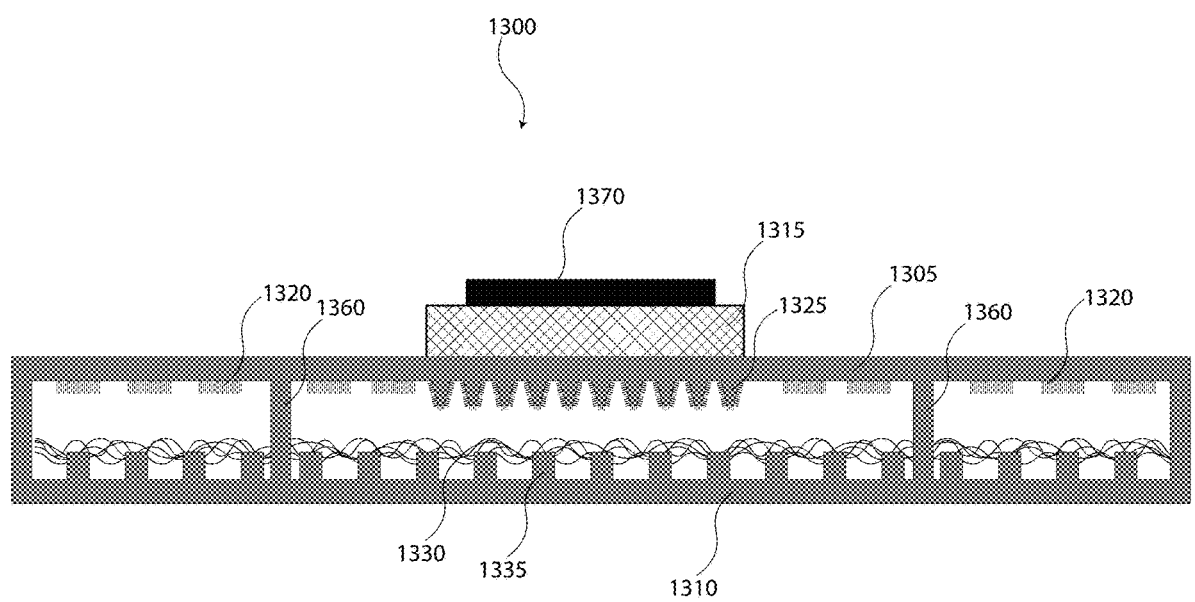
FIG. 13 illustrates an example thermal ground plane with hybrid structures according to some embodiments.

In some embodiments, a thermal ground plane may spread high heat flux with a much lower temperature difference in the evaporation region by inserting a diamond or similar high thermal conductivity heat spreader between the heat source and the thermal ground plane. FIG. 13 shows a semiconductor device 1370 (e.g., a processor, memory GaN device, a power amplifier (PA) device, a switching device, etc.) bonded to a diamond heat spreader 1315. The diamond heat spreader 1315, may be bonded to a thermal ground plane that includes a hybrid structure and/or one or more meshes. Some embodiments can reduce high heat flux of 1,400 W/cm$^2$ to 6.2 W/cm$^2$ with a 25° C. difference. Any size of thermal ground plan may be used. In this example, the thermal ground plan has dimensions of 7.5 cm×7.5 cm.

In some embodiments, a thermal ground plane can be scaled up to accommodate multiple heat sources. For example, multiple evaporator regions may be formed, for example, at, near, with, etc. one or more hybrid structures.

In some embodiments, a thermal ground plane with hybrid structures may operate over an operating temperature range of 0 to 80° C. and/or a survival temperature range of −60 to 100° C. In some embodiments, a thermal ground plane with hybrid structures may operate at 160° C. or higher.

FIG. 13 illustrates an example thermal ground plane 1300 with plurality of microstructures 1325, mechanical support pillars 1360, and an external heat spreader 1315 according to some embodiments. In some embodiments, the external heat spreader 1315 may include a CVD diamond heat spreader. In some embodiments, the external heat spreader 1315 may be coupled with one or more heat sources in use. The heat sources may include any type of semiconductor device 1370 such as, for example, a GaN device.

In some embodiments, the thermal ground plane 1300 may include an array of copper nanowires 1320 coupled with a first casing 1305, microstructures 1325 that include nanowires patterned on angled copper coupled with the first casing 1305 (e.g., for enhanced surface area evaporation), copper mesh 1330 disposed on a plurality of microchannel grooves 1335 coupled with second casing 1310 (e.g., for wicking), and a heat spreader 1315 between the thermal ground plane and the heat source. In this example, the microstructures 1325 may be disposed on the interior surface of the first casing 1305 opposite the heat spreader 1315 which is disposed on the exterior of the first casing 1305. In addition, the microstructures 1325 may include a plurality of grooved extended or raised members that extend vertically and may include a number of grooves along the length of the first casing 1305. Heat evaporation and/or heat transfer, for example, may occur at the microstructures 1325.

The heat spreader 1315, for example, may reduce the heat flux from the second casing 1310 at 1,400 W/cm$^2$ to the top surface of the first casing 1305 in the range 50~200 W/cm$^2$, which can then be further reduced by the thermal ground plane in the nucleate boiling regime with nanowires. In some embodiments, the boiling heat transfer coefficients may be in the range of 50~100 kW/m$^2$K using nanowire structures. In some embodiments, hybrid structures 1325 including nanowires for example, on a grooved copper surface, can improve the effective boiling heat transfer coefficient beyond 200 kW/m$^2$K.

Figure 14:
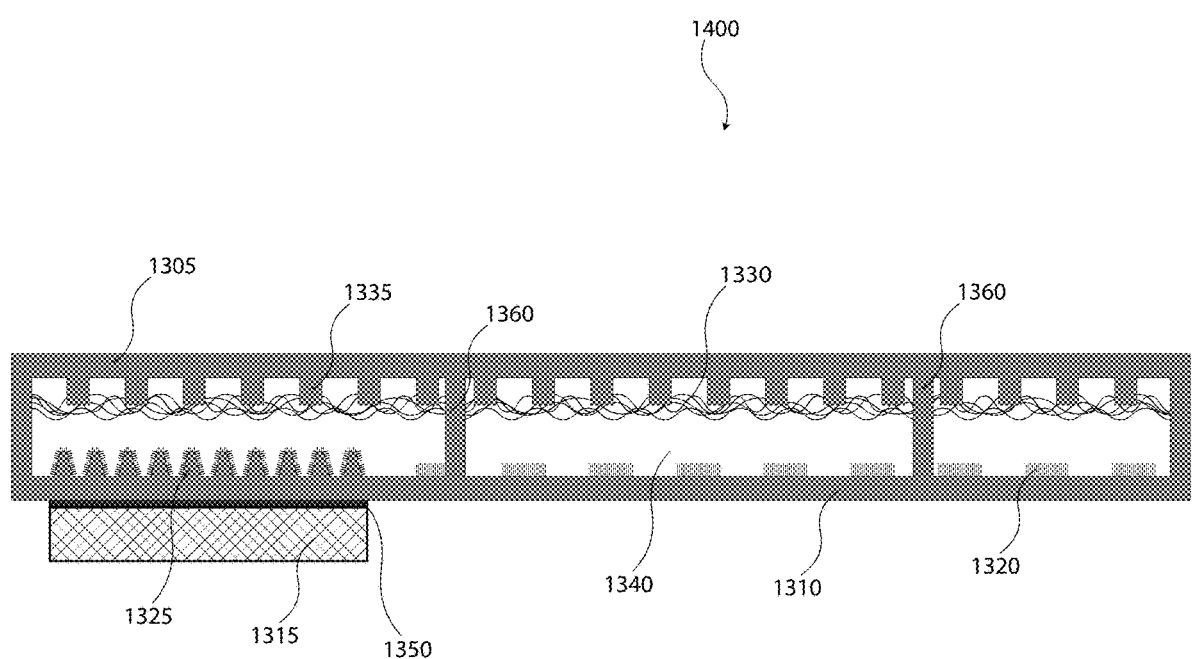
FIG. 14 illustrates an example thermal ground plane with an external heat spreader according to some embodiments.

FIG. 14 illustrates an example thermal ground plane 1400 with hybrid structures according to some embodiments. Thermal ground plane 1400 includes a first casing 1305 and a second casing 1310. A vapor core 1340 is formed within the thermal ground plane 1300 between the first casing 1305 and the second casing 1310. A heat spreader 1315 (e.g., a diamond heat spreader) may be coupled with an exterior surface of the second casing 1310. The heat spreader 1315 may be coupled with the exterior surface of the second casing 1310, for example, using a solder 1350 such as, for example, a high temperature solder or an indium solder. The evaporator region may be formed in the area near the heat spreader 1315 and/or near the plurality of microstructures 1325. The thermal ground plane 1400 may be used so that the heat spreader 1315 is placed near heat producing circuit elements such as, for example, processors, memory, GaN devices, etc. In some embodiments, the thermal ground plane 1400 may have a width and/or a length of about 10 mm to 100 mm (e.g., 25 mm) and/or a thickness of about 0.5 mm to 3.0 mm (e.g., 1 mm).

In some embodiments, a first portion of an interior surface of the second casing 1310 may include a plurality of microstructures 1325. The plurality of microstructures 1325, for example, may include a plurality of textured pyramid shaped structures (or trapezoidal shaped structures, or groves) with copper nanowires disposed thereon. In some embodiments, the plurality of microstructures 1325 may be disposed on the first portion of the interior surface of the second casing 1310 opposite the exterior surface of the second casing 1310 where or near the heat spreader 1315. In some embodiments, a second portion of an interior surface of the second casing 1310 may include a plurality of pillars 1360. In some embodiments, an interior surface of the first casing 1305 may include a plurality of ridges 1335 (or grooves) and/or a mesh 1330 in contact, disposed on top, and/or coupled with etc. the ridges 1335. In some embodiments, the ridges may comprise copper.

In some embodiments, a thermal ground plane having a width and/or length of 25 mm, and/or a height of 1 mm, and boiling heat transfer coefficient of 200,000 W/m$^2$K, the temperature difference between a circuit disposed near the heat spreader 1315 and liquid within the vapor core 1340 may be 23° C.

In embodiments or examples having a diamond heat spreader, for example, a temperature difference across the diamond heat spreader may be 12° C. As another example, the temperature difference resulting from boiling or evaporation may be around 11° C. As another example, the vapor transport and condensation may be around 2° C.

In some embodiments, the density of nanowire bundles can be varied. For example, a relatively wide spacing can be used such as, for example, 65 μm between bundles over the condenser region to reduce liquid flow resistance, and increase the bundle density by decreasing the spacing to 20 μm centered over the heater.

In some embodiments, nanostructures can be encapsulated with a protective film such as, for example, an ALD ceramic film, to enhance its surface properties or to protect it from water corrosion. In some embodiments, nanowires can be encapsulated with one or more layers such as, for example, layers of $Al_2O_3$, $TiO_2$, and/or $SiO_2$ deposited by ALD. Any type of protective film can be used on the nanostructure such as, for example, chemical reactive processes to form a thin layer coating. The protective film, for example, may be hydrophilic.

Figure 15:
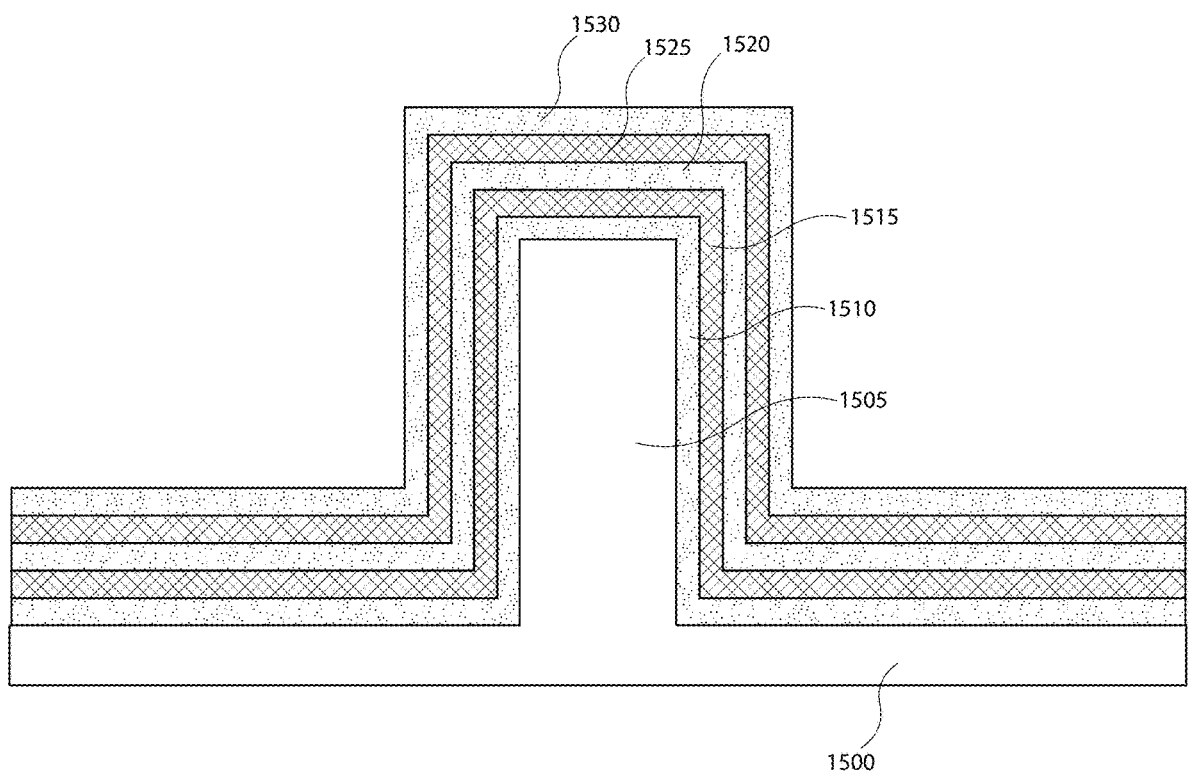
FIG. 15 illustrates an example nanowire with a laminate coating.

FIG. 15 illustrates an example nanowire 1505 deposited on casing 1500 and has an $Al_2O_3$ adhesion layer 1510 along with layers of $TiO_2$ 1515 and 1525 as well as layers of $SiO_2$ 1520 and 1530. In some embodiments, each layer may be annealed separately and/or at different temperatures.

In some embodiments, a circuit may include a thermal ground plane that can spread high heat fluxes in a compact package. The package is illustrated by a ball-grid-array (BGA) package with the high heat flux thermal ground plane as a built-in heat spreader. The real package is in fact very thin with 30 mm in length and only 1 mm in thickness. The multichip module can carry 2 to 4 chips and other chips as shown.

In some embodiments, a thermal ground plane may spread high heat fluxes in transient. For example, to remove an extremely large amount of heat generated over a short period of time, a thermal ground plane with hybrid structures may be used. For example, a 5-mm thick thermal ground plane can be attached to a heat spreader through a thermal interface material. When a very large hot region, e.g. a circular region of 7 cm, is heated by a high heat flux heating source, the working fluid might evaporate and absorb heat with an extremely high heat flux, e.g. 1,000 $W/cm^2$. In such a situation, vapor would then be transported with a near sonic speed to the rest of thermal ground plane. During the heating period, e.g. 30 seconds, the working fluid in the working fluid supply region, e.g. a circular region with a diameter of about 60 cm, would supply working fluid to the hot region through thermal ground plane's wicking layer. The wicking speed needed can be as low as 1 cm/sec. Based on our estimate, only 2 mm of liquid water in the working fluid supply region is needed to remove this extremely large amount of heat for a short period of time. The entire thermal ground plane will be returned to normal through condensation and continuous liquid supply after the transient heating period. Some results calculated are summarized below:

In some embodiments, effective thermal conductivity of thermal ground plane can be about 26,000 W/mK. In some embodiments, it should be noted that the solution uses evaporation and vapor transport to remove 38,500 Watts with a heat flux of 1,000 $W/cm^2$ over 30 seconds. It is a novel and effective cooling concept, for example, to remove a large amount of heat over a short period of time, e.g. 30 second.

In some embodiments, a maximum temperature on the thermal ground plane's skin (source temperature) may be 150° C. In some embodiments, maximum vapor temperature may be 132° C. (corresponding internal absolute pressure of thermal ground plane=2.86 bar). Air temperature is 22° C. (sink temperature), and most of thermal ground plane's skin temperatures would be close to the air temperature in regions away from the heating zone.

In some embodiments, a thermal ground plane may remove heat using latent heat of evaporation and/or effective water supply during the heating period.

In some embodiments, a single thermal ground plane may be laminated to cover a large size substrate or casing with an area of about 2,500 $cm^2$.

Figure 16:
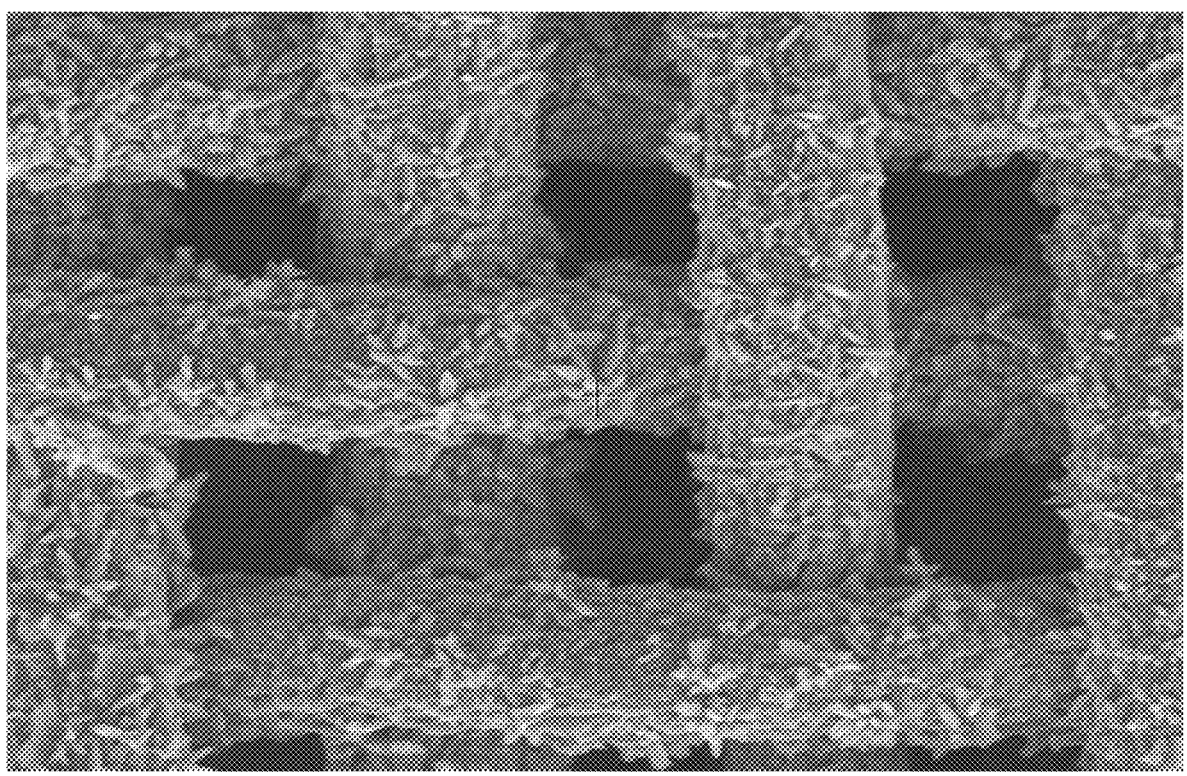
FIG. 16 illustrates an example nanowire structure.

FIG. 16 illustrates an example nanostructure. This nanostructure includes a weave of material with a diameter having a dimension less than 500 nm. As another example, the dimension may be less than about 100 nm.

The term "substantially" or "about" means within 5% or 10% of the value referred to or within manufacturing tolerances.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting. While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A thermal ground plane comprising:
a first casing having an exterior surface and an interior surface, the interior surface having an evaporator region and a non-evaporator region;
a plurality of microstructures having a three dimensional shape that includes a trapezoidal cross-section, the plurality of microstructures extending from the evaporator region of the interior surface of the first casing, the plurality of microstructures having an extended surface;
a first plurality of nanowires disposed on each of the plurality of microstructures, the first plurality of nanowires extending from the extended surface of the microstructures, the first plurality of nanowires comprising copper, and the first plurality of nanowires being formed via electroplating;
a second plurality of nanowires extending from portions of the non-evaporator region of the interior surface of the first casing, the second plurality of nanowires comprising copper, and the second plurality of nanowires being formed via electroplating;
a second casing, wherein the first casing and the second casing are sealed together to form an interior space that includes a working fluid; and
a wicking structure disposed within the interior space.

2. The thermal ground plane according to claim 1, wherein each of the plurality of nanowires are fabricated by depositing an aluminum layer on a copper microstructure to form a porous anodic alumina template followed by electroplating.

3. The thermal ground plane according to claim 1, wherein the plurality of microstructures comprises a trapezoidal or pyramidal shape.

4. The thermal ground plane according to claim 1, wherein each of the plurality of microstructures are fabricated by a technique selected from the list consisting of micro-stamping, partially metal cutting, reactive ion etching (ME), and electroplating.

5. The thermal ground plane according to claim 1, wherein the plurality of microstructures comprises a forest of micro-posts with caps.

6. The thermal ground plane according to claim 1, further comprising a laminate layer with different materials disposed on the plurality of nanowires.

7. The thermal ground plane according to claim 1, further comprising a plurality of nanowires disposed on a planar portion of the interior surface of the first casing.

8. The thermal ground plane according to claim 1, further comprises an integral part of a package for a device to be cooled.

9. A thermal ground plane comprising:
a first casing having an exterior surface and an interior surface, the interior surface having an evaporator region and a non-evaporator region;
a plurality of microstructures having a three dimensional shape that includes a trapezoidal cross-section, the plurality of microstructures extending from the evaporator region of the interior surface of the first casing, the plurality of microstructures having an extended surface;
a second casing, wherein the first casing and the second casing are sealed to form an interior space that includes a working fluid;
a plurality of grooves and a plurality of ridges disposed on the second casing;
a wicking structure disposed within the interior space with at least a portion of the wicking structure in contact with some of the plurality of ridges in the second casing; and
a heat spreader disposed on the exterior surface of the first casing opposite the evaporator region, the heater spreader reducing the heat flux of the thermal ground plane at least 50 W/cm².

10. The thermal ground plane according to claim 9, further comprising:
a first plurality of nanowires disposed on each of the plurality of microstructures, the first plurality of nanowires extending from the extended surface of the microstructures.

11. A thermal ground plane comprising:
a first casing having an exterior surface and an interior surface having an evaporator region and a non-evaporator region;
a plurality of microstructures having a three dimensional shape that includes a trapezoidal cross-section, the plurality of microstructures extending from the evaporator region of the interior surface of the first casing, the plurality of microstructures having an extended surface;
a second casing, wherein the first casing and the second casing are sealed together to form an interior space that includes a working fluid; and
a plurality of grooves and a plurality of ridges disposed on the second casing;
a wicking structure disposed within the interior space with at least a portion of the wicking structure in contact with some of the plurality of ridges in the second casing, the wicking structure comprising a nanostructure including a weave of material with a diameter having a dimension less than 500 nm.

12. The thermal ground plane system according to claim 11, wherein the heat flux comprises a heat flux of 1,000 W/cm2.

13. The thermal ground plane system according to claim 11, further comprising a heat spreader disposed on the exterior surface of the first casing.

14. The thermal ground plane system according to claim 11, wherein the wicking structure comprises a woven copper mesh.

15. The thermal ground plane system according to claim 11, wherein the interior surface of the first casing includes a plurality of nanostructures.

16. The thermal ground plane system according to claim 9, wherein the heat spreader couples with a GaN device.

17. The thermal ground plane system according to claim 9, wherein the wicking structure comprises a woven copper mesh.

18. The thermal ground plane system according to claim 9, wherein the interior surface of the first casing includes a plurality of nanostructures.

* * * * *